US012635498B2

(12) United States Patent
Lanzillo et al.

(10) Patent No.: US 12,635,498 B2
(45) Date of Patent: May 19, 2026

(54) STACKED DEVICES WITH BACKSIDE CONTACTS

(71) Applicant: International Business Machines Corporation, Armonk, NY (US)

(72) Inventors: Nicholas Anthony Lanzillo, Wynantskill, NY (US); Brent A. Anderson, Jericho, VT (US); Ruilong Xie, Niskayuna, NY (US); Albert M. Chu, Nashua, NH (US); Lawrence A. Clevenger, Saratoga Springs, NY (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 424 days.

(21) Appl. No.: 18/337,318

(22) Filed: Jun. 19, 2023

(65) Prior Publication Data

US 2024/0421038 A1 Dec. 19, 2024

(51) Int. Cl.
| | |
|---|---|
| *H10W 20/20* | (2026.01) |
| *H10W 20/41* | (2026.01) |
| *H10W 20/42* | (2026.01) |

(52) U.S. Cl.
CPC ........... *H10W 20/20* (2026.01); *H10W 20/42* (2026.01); *H10W 20/435* (2026.01)

(58) Field of Classification Search
CPC ............... H01L 23/481; H01L 23/5226; H01L 23/5283; H01L 23/5286; H10W 20/20; H10W 20/42; H10W 20/435; H10W 20/427
See application file for complete search history.

(56) References Cited

U.S. PATENT DOCUMENTS

| | | | |
|---|---|---|---|
| 9,679,906 | B2 | 6/2017 | Lu et al. |
| 10,734,412 | B2 | 8/2020 | Glass et al. |
| 11,152,284 | B1 | 10/2021 | Sato et al. |
| 11,289,455 | B2 | 3/2022 | Kao et al. |
| 11,349,004 | B2 | 5/2022 | Yu et al. |
| 11,387,218 | B2 | 7/2022 | Xiao et al. |
| 11,437,283 | B2 | 9/2022 | Lilak et al. |
| 2019/0393214 | A1* | 12/2019 | Lilak ...................... B82Y 10/00 |
| 2020/0235098 | A1* | 7/2020 | Li ...................... H10D 30/6735 |
| 2021/0384106 | A1* | 12/2021 | Do ......................... H10D 89/10 |
| 2022/0310804 | A1 | 9/2022 | Su et al. |
| 2022/0367658 | A1 | 11/2022 | Yim et al. |

* cited by examiner

*Primary Examiner* — Herve-Louis Y Assouman
(74) *Attorney, Agent, or Firm* — Kimberly Zillig; Ryan, Mason & Lewis, LLP

(57) ABSTRACT
A semiconductor structure includes a stacked device structure containing a first device and a second device over the first device in a stacked configuration. The semiconductor structure further includes a first backside contact connected to the first device and a first backside power line. The semiconductor structure further includes a second backside contact connected to the second device and a second backside power line.

20 Claims, 7 Drawing Sheets

400

STACKED DEVICES WITH BACKSIDE CONTACTS

BACKGROUND

Stacking devices such as field-effect transistors (FETs) in the vertical direction gives an additional dimension for complementary metal-oxide-semiconductor (CMOS) area scaling. A FET is a transistor having a source, a gate, and a drain, the operation of which depends on the flow of carriers (electrons or holes) along a channel that runs between the source and drain. Current through the channel between the source and drain may be controlled by a transverse electric field under the gate. FETs are widely used for switching, amplification, filtering, and other tasks.

SUMMARY

Illustrative embodiments of the present application include techniques for use in semiconductor manufacture. In an illustrative embodiment, a semiconductor structure comprises a stacked device structure comprising a first device and a second device over the first device in a stacked configuration. The semiconductor structure further comprises a first backside contact connected to the first device and a first backside power line. The semiconductor structure further comprises a second backside contact connected to the second device and a second backside power line.

Another exemplary embodiment includes an integrated circuit, comprising one or more semiconductor structures. At least one of the one or more semiconductor structures comprises a stacked device structure comprising a first device and a second device and a second device over the first device in a stacked configuration. The at least one of the one or more semiconductor structures further comprises a first backside contact connected to the first device and a first backside power line. The at least one of the one or more semiconductor structures further comprises a second backside contact connected to the second device and a second backside power line.

Another exemplary embodiment includes a method comprising forming a second device over a first device in a stacked configuration. The method further comprises forming a first backside contact connected to the first device. The method further comprises forming a second backside contact connected to the second device. The method further comprises forming a first backside power line connected to the first backside contact. The method further comprises forming a second backside power line connected to the second backside contact.

These and other features, objects and advantages of the present disclosure will become apparent from the following detailed description of illustrative embodiments thereof, which is to be read in connection with the accompanying drawings.

DETAILED DESCRIPTION

Figure 2:
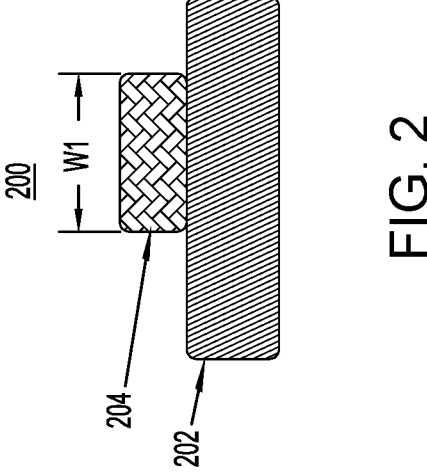
FIG. 2 is a schematic cross-sectional side view of a semiconductor structure at a first-intermediate stage of fabrication, according to one or more illustrative embodiments.

Illustrative embodiments of the invention may be described herein in the context of illustrative methods for forming semiconductor structures having stacked devices configured to each include a backside contact connected to one or more backside wirings such as a backside power line, along with illustrative apparatus, structures and devices formed using such methods. However, it is to be understood that embodiments of the invention are not limited to the illustrative methods, apparatus, structures and devices but instead are more broadly applicable to other suitable methods, apparatus, structures and devices.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well as any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., an interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

In the IC chip fabrication industry, there are three sections referred to in a typical IC chip build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices. Accordingly, illustrative embodiments described herein may be directed to BEOL semiconductor processing and structures. BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-to-package connections. In the BEOL, part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Figure 1:
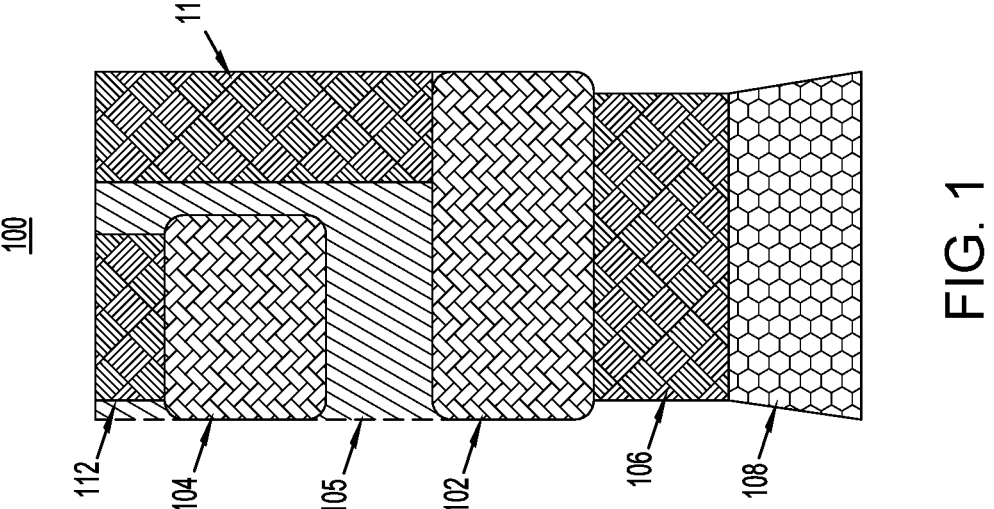
FIG. 1 is a schematic cross-sectional side view of a conventional semiconductor structure.

Conventional semiconductor structures such as semiconductor structure 100 as generally illustrated in FIG. 1 include a first device 102 such as a transistor device, e.g., a nanosheet transistor with epitaxial source/drain regions, and a second device 104 such as another transistor device, e.g., a nanosheet transistor with epitaxial source/drain regions, in a stacked configuration with the first device 102. For purposes of illustration, other layers typically used in semiconductor fabrication such as interlevel dielectric layers, middle drain isolation layers, etc. are shown as layer 105 for ease of illustration but are well known to one skilled in the art. First device 102 includes backside contact 106 connected to backside wiring 108 such as backside power lines. First device 102 further includes metal via 110 to connect first device 102 to the frontside of semiconductor structure 100 such as, for example, to frontside power rails. Second device 104 includes metal contact 112 such as, for example, a gate contact, source/drain contact and the like. The stacked configuration of the first device 102 and second device 104 prevents the first device 102 and second device 104 from both being able to connect to a backside wiring such as backside power lines via a backside contact. The conventional semiconductor structures only allow for wider bottom devices (i.e., first device 102).

There is a need therefore to form semiconductor structures without the above drawbacks. Accordingly, non-limiting illustrative embodiments described herein overcome the drawbacks discussed above by forming a first device and a second device in a stacked configuration with the first device with each of the first device and the second device being connected to a backside wiring utilizing a backside contact. The semiconductor structures according to the illustrative embodiments described herein advantageously allow for a top device which is wider than the bottom device, a top device that can be wider in regions with no frontside connection to the bottom device and a top device that is staggered/narrow when forming a frontside connection to the bottom devices. In addition, semiconductor structures according to the illustrative embodiments described herein also advantageously allow for both the bottom and top devices to have power supplied from the backside thereby leaving more wiring resources for the frontside. For example, in some embodiments, the width of the top device can allow for either or both devices to be supplied with power from the top or, in other embodiments, just the bottom device can be supplied with power from the bottom. As a further example, in some embodiments, the width of the bottom device can allow for both the top and bottom devices to be powered from the wafer backside thereby leaving room wiring resources for other purposes on the front side.

An illustrative embodiment for forming a semiconductor structure will be discussed below with reference to FIGS. 2-13. As one skilled in the art will appreciate, these figures are illustrative and some components of the semiconductor structures including first device 204 (i.e., bottom device) and second device 206 (i.e., top device) are left out for illustrative purposes. Methods for forming the semiconductor structures are within the purview of one skilled in the art. Other features of the semiconductor structures disclosed herein are contemplated herein and also well within the purview of one skilled in the art. For example and illustrative purposes only, other layers typically used in semiconductor fabrication such as interlevel dielectric layers, middle drain isolation layers, etc. are shown as layer 205 for ease of illustration but are well known to one skilled in the art and typically used in semiconductor fabrication.

Referring now to the figures, FIG. 2 is a cross-sectional view of semiconductor structure 200 including semiconductor substrate 202 and a first device 204. The semiconductor substrate 202 may be formed of any suitable semiconductor material, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, semiconductor substrate 202 is silicon.

First device 204 can be any type of device known in semiconductor fabrication. In one illustrative embodiment, first device 204 is a transistor device. For example, in one illustrative embodiment, a suitable transistor device can be a fin field-effect transistor (FINFET) device or a nanosheet field-effect transistor (FET) device. FINFETS utilize a vertical channel structure, comprised of one or more vertical semiconductor fins, for increasing the surface area of the channel exposed to the gate. Thus, in FINFET structures, the gate can more effectively control the channel, as the gate extends over more than one side or surface of the channel. Accordingly, FINFET devices utilize one or more vertical semiconductor fins that are gated on at least two sides of each of the vertical semiconductor fins, as well as a source region and a drain region adjacent to the fin on opposite sides of the gate. FINFET structures having n-type source and drain regions may be referred to as n-FINFETs, and FINFET structures having p-type source and drain regions may be referred to as p-FINFETs.

In illustrative embodiments, a nanosheet FET device is comprised of, for example, one or more nanosheets of semiconductor channel layers, source/drain regions, and a replacement gate. As one skilled in the art would understand, a FET device can have a variety of different structures. In one illustrative embodiment, a FET device can be fabricated with the source, channel, and drain formed in the substrate material itself, where the current flows horizontally (i.e., in the plane of the substrate). In another illustrative embodiment, a FET device can be fabricated with the channel extending outward from the substrate, but where the current also flows horizontally from a source to a drain. FET structures having n-type source and drain regions may be referred to as n-FETs, and FET structures having p-type source and drain regions may be referred to as p-FETs.

In non-limiting illustrative embodiments, first device 204 can have a width, W1, ranging from about 5 to about 50 nanometers (nm).

Figures 3, 4, 5:
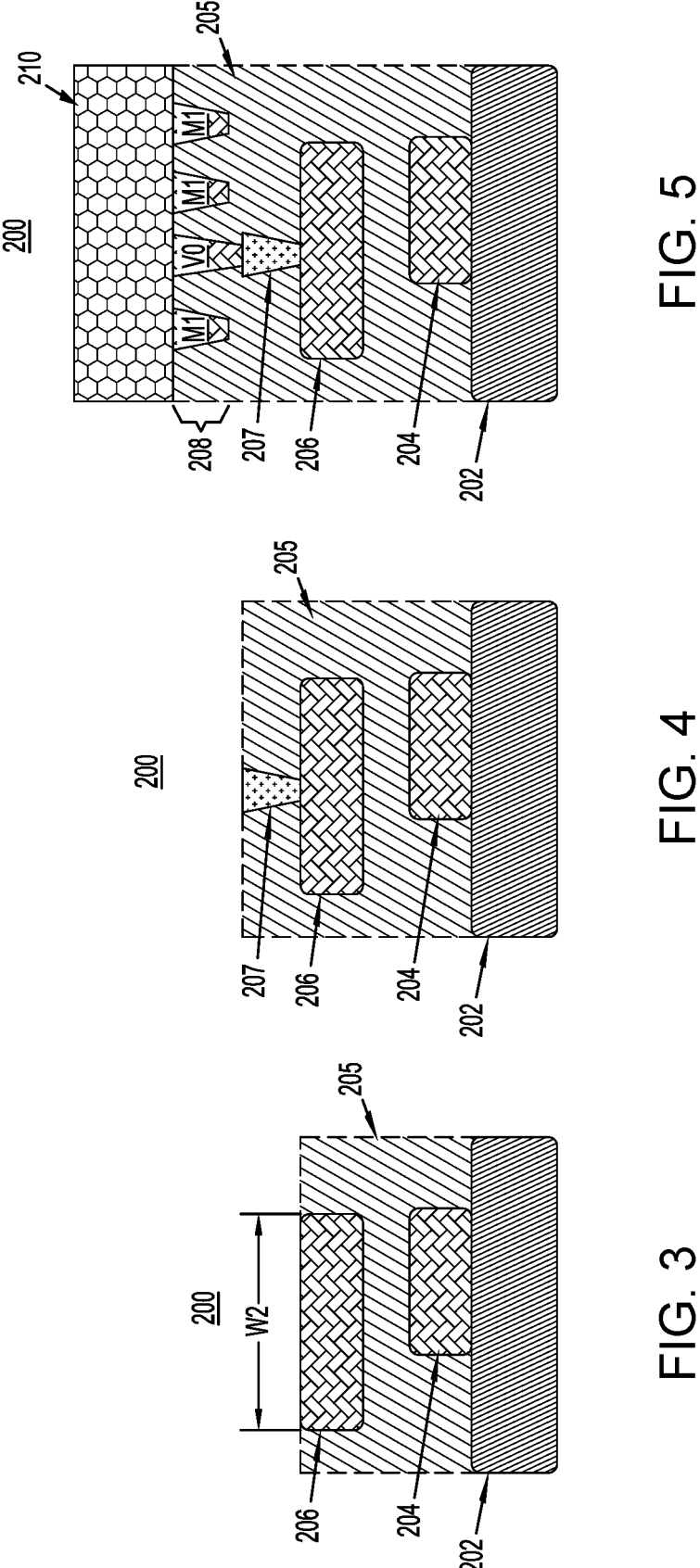
FIG. 3 is a schematic cross-sectional side view of the semiconductor structure at a second-intermediate stage of fabrication, according to one or more illustrative embodiments.
FIG. 4 is a schematic cross-sectional side view of the semiconductor structure at a third-intermediate stage of fabrication, according to one or more illustrative embodiments.
FIG. 5 is a schematic cross-sectional side view of the semiconductor structure at a fourth-intermediate stage of fabrication, according to one or more illustrative embodiments.

FIG. 3 shows semiconductor structure 200 at a second-intermediate fabrication stage. During this stage, second device 206 is formed over first device 204 in a stacked configuration. As mentioned above, layers typically used in semiconductor fabrication have been left out for ease of illustration but are well known to one skilled in the art. In one illustrative embodiment, second device 206 is a transistor device. For example, in one illustrative embodiment, a suitable transistor device can be a FINFET device or a nanosheet FET device as discussed above for first device 204.

In non-limiting illustrative embodiments, second device 206 can have a width, W2, greater than the width, W1, of first device 204. In an illustrative embodiment, second device 206 can have a width, W2, ranging from about 10 to about 100 nm.

In non-limiting illustrative embodiments, first device 204 and second device 206 are both nanosheet FET devices. In non-limiting illustrative embodiments, first device 204 and second device 206 are both FINFET devices. In non-limiting illustrative embodiments, first device 204 is a nanosheet FET device and second device 206 is a FINFET device. In non-limiting illustrative embodiments, first device 204 is a FINFET device and second device 206 is a nanosheet FET device. The types of devices described herein are merely illustrative and any type of device is contemplated herein.

FIG. 4 shows semiconductor structure 200 at a third-intermediate fabrication stage. During this stage, middle-of-the-line (MOL) contact 207 can be formed on second device 206. For example, an MOL contact opening can be formed in an interlevel dielectric (ILD) layer formed over second device 206. The ILD layer may be formed of any suitable isolating material, such as $SiO_2$, SiOC, SiON, etc. Next, a conductive metal can be deposited in the MOL contact opening to form MOL contact 207. Suitable conductive metals include any conductive material such as, for example, tungsten (W), aluminum (Al), copper (Cu), cobalt (Co), nickel (Ni), titanium (Ti), ruthenium (Ru), molybdenum (Mo), or any other suitable conductive material.

FIG. 5 shows semiconductor structure 200 at a fourth-intermediate fabrication stage. During this stage, frontside back-end-of-line (BEOL) interconnect 208 is formed followed by bonding of the structure (e.g., the frontside BEOL interconnect 208) to a carrier wafer 210. The frontside BEOL interconnect 208 includes various BEOL interconnect structures. For example, frontside BEOL interconnect 208 is a metallization structure that includes one or more metal layers disposed on a side of semiconductor structure 200 opposite of the side on which the backside BEOL metallization structure is disposed. In general, the metal lines (also referred to as wiring lines) provide electrical connections within the same metal level, and conductive vias provide inter-level or vertical connections between different (metal) line levels. The metal lines (M1) and conductive via (V0) are typically formed by etching a recess in a layer of dielectric material and filling the recess with a metal such as copper, tungsten, aluminum, etc., and corresponding barrier layers. Typically, the conductive vias (i.e., a V0 via) are used to establish an electrical connection between the M1 metal lines and the underlying device level contacts (e.g., MOL contact 207).

The carrier wafer 210 may be formed of materials similar to that of the semiconductor substrate 202, and may be formed over the frontside BEOL interconnect 208 using a wafer bonding process, such as dielectric-to-dielectric bonding.

Figure 6:
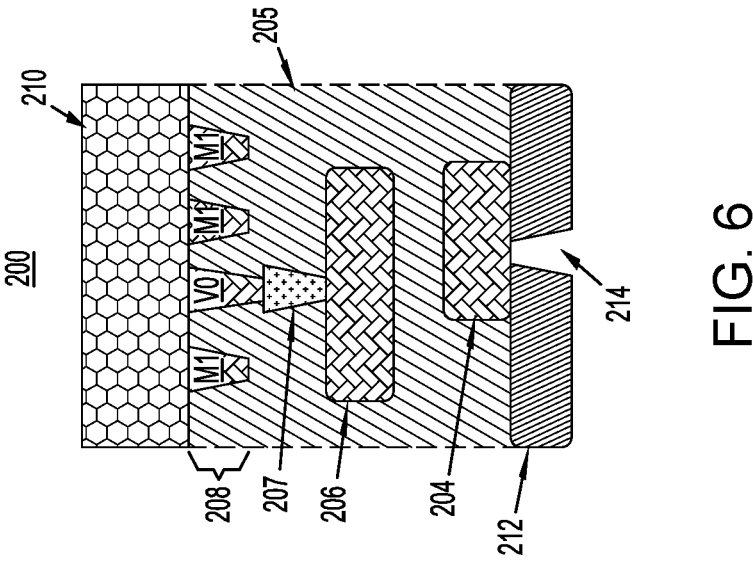
FIG. 6 is a schematic cross-sectional side view of the semiconductor structure at a fifth-intermediate stage of fabrication, according to one or more illustrative embodiments.

FIG. 6 shows semiconductor structure 200 at a fifth-intermediate fabrication stage. During this stage, semiconductor structure 200 is subjected to various processing steps such as removing of the semiconductor substrate 202 from the backside using by, for example, flipping the semiconductor structure 200 over using the carrier wafer 210 so that the backside of the semiconductor substrate 202 (i.e., the back surface) is facing up. Following the various processing steps as known in the art, a via 214 is formed in backside ILD layer 212 to expose first device 204 using any standard lithographic and etch processing. Backside ILD layer 212 may be formed of any suitable isolating material, such as $SiO_2$, SiOC, SiON, etc. The material of the backside ILD layer 212 may initially be overfilled, followed by planarization (e.g., using chemical mechanical planarization (CMP)).

Figure 7:
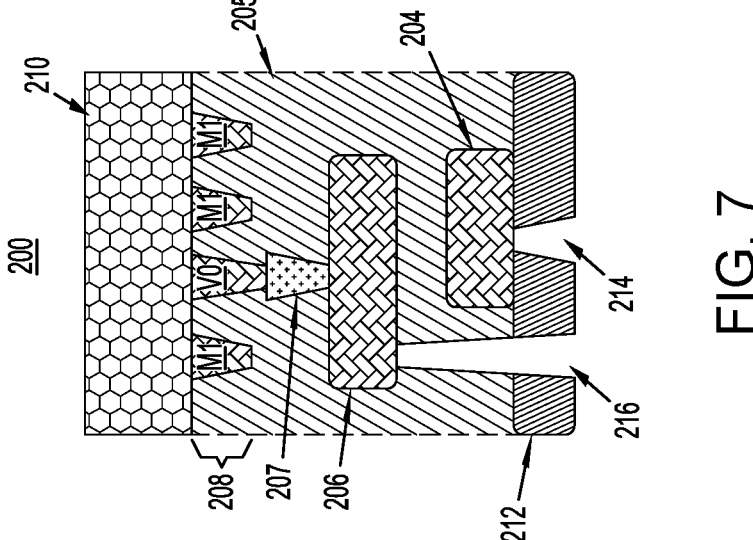
FIG. 7 is a schematic cross-sectional side view of the semiconductor structure at a sixth-intermediate stage of fabrication, according to one or more illustrative embodiments.

FIG. 7 shows semiconductor structure 200 at a sixth-intermediate fabrication stage. During this stage, via 216 is formed in backside ILD layer 212 and any additional layers previously formed as discussed above to expose second device 206 using any standard lithographic and etch processing. In an illustrative embodiment, via 214 is of a first height and via 216 is of a second height greater than the first height.

Figures 8, 9, 10:
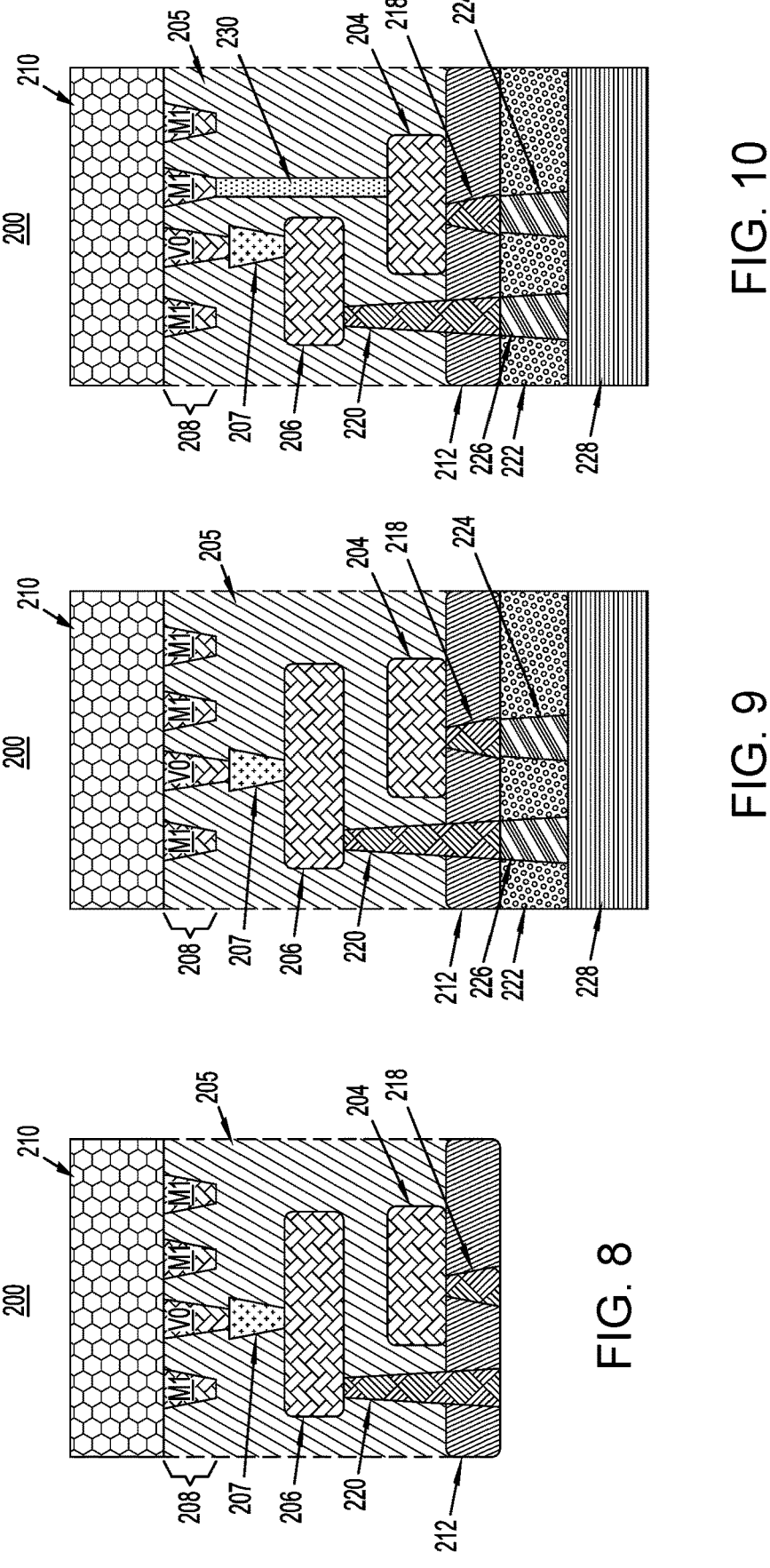
FIG. 8 is a schematic cross-sectional side view of the semiconductor structure at a seventh-intermediate stage of fabrication, according to one or more illustrative embodiments.
FIG. 9 is a schematic cross-sectional side view of the semiconductor structure at an eighth-intermediate stage of fabrication, according to one or more illustrative embodiments.
FIG. 10 is a schematic cross-sectional side view of a semiconductor structure, according to one or more alternative illustrative embodiments.

FIG. 8 shows semiconductor structure 200 at a seventh-intermediate fabrication stage. During this stage, a suitable conductive metal is then deposited in vias 214 and 216, followed by CMP to remove any metal on top of backside ILD layer 212 to form backside contacts 218 and 220. Suitable conductive metals include any conductive material such as, for example, tungsten (W), aluminum (Al), copper (Cu), cobalt (Co), nickel (Ni), titanium (Ti), ruthenium (Ru), molybdenum (Mo), or any other suitable conductive material. In an illustrative embodiment, backside contact 218 is of a first height and backside contact 220 is of a second height greater than the first height.

FIG. 9 shows semiconductor structure 200 at an eighth-intermediate fabrication stage. During this stage, a level of backside wiring is formed to connect with backside contact 218 and backside contact 220. For example, additional backside ILD layer 222 is first formed on semiconductor structure 200, followed by forming backside power lines 224 and 226 utilizing conventional lithographic and etching processes such as RIE in backside ILD layer 222 to create openings followed by depositing a suitable conductive metal in the openings. Suitable conductive metals for forming backside power lines 224 and 226 may include any of those discussed above. Backside power lines 224 and 226 can include, for example, backside ground (GND or Vss) rails to provide a series of power supplies, backside power (Vdd) rails to provide supply voltage to the structure or a second supply voltage (VDD2). In an alternate embodiment, the backside power lines 224 and 226 could carry a signal if the backside contact connects to a gate as opposed to a source/drain epitaxial region.

Next, backside power delivery network 228 is formed over the semiconductor structure 200 including backside power lines 224 and 226 and is based on creation of a wiring scheme that is disposed on both sides of the device layer (front end of line structure).

According to an alternative embodiment as generally depicted in FIG. 10, semiconductor structure 200 can include first device 204 and second device 206 stacked over first device 204 in a staggard configuration. This advantageously allows for a formation of a frontside metal via 230 connecting first device 204 to the frontside BEOL interconnect 208.

Figure 11:
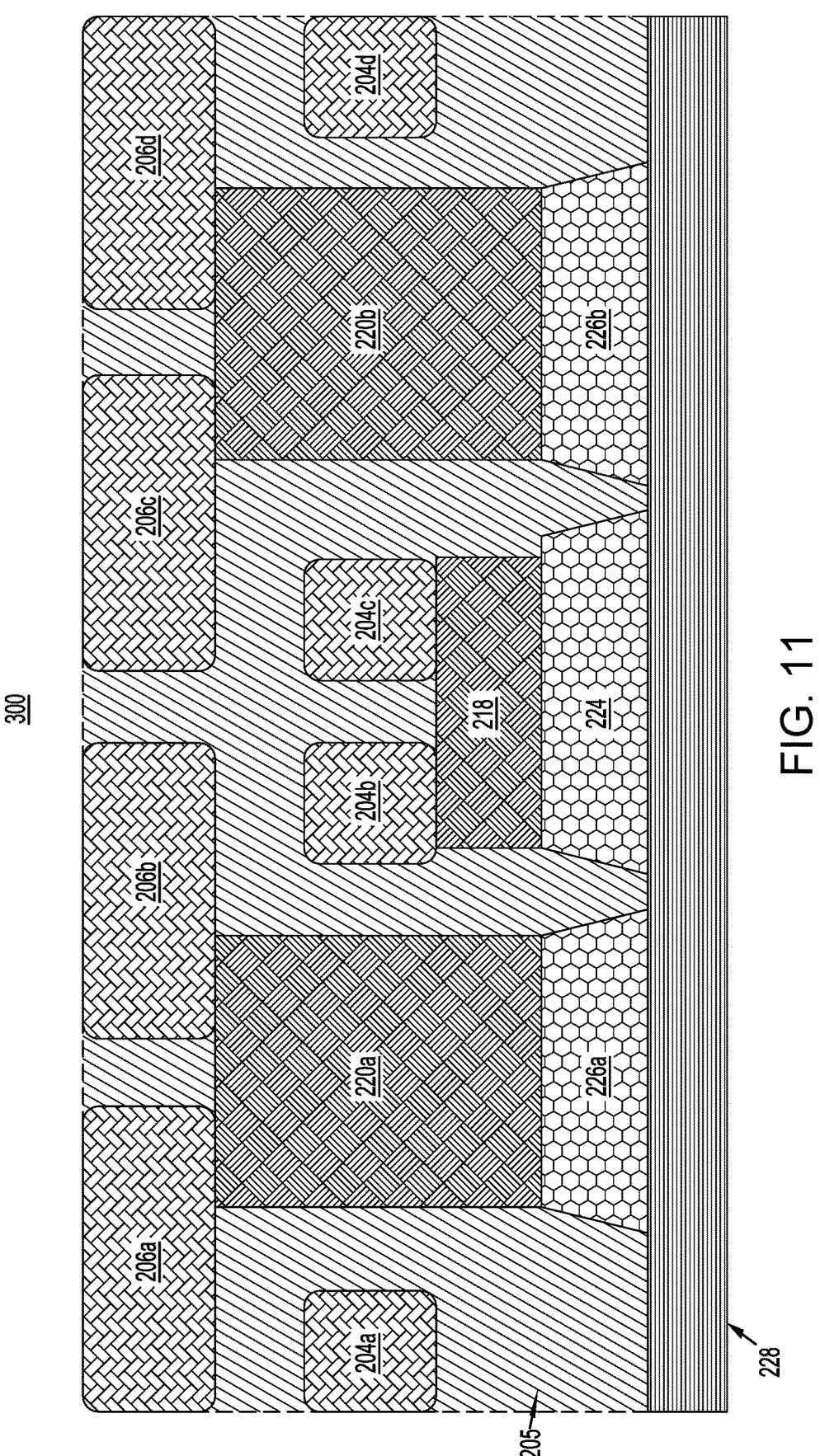
FIG. 11 is a schematic cross-sectional side view of a semiconductor structure, according to one or more alternative illustrative embodiments.

As one skilled in the art will readily appreciate, the resulting semiconductor structure 200 advantageously allows for formation of multiple first and second devices connected to power supplies on the frontside and backside of the semiconductor structure 200. For example, in a non-limiting illustrative embodiment as generally depicted in FIG. 11, semiconductor structure 300 includes second devices 206a, 206b, 206c and 206d formed in a stacked configuration with respective first devices 204a, 204b, 204c and 204d. First devices 204b and 204c are connected to backside power line 224 via backside contact 218. Second devices 206a and 206b are connected to backside power line 226a via backside contact 220a, and second devices 206c and 206d are connected to backside power line 226b via backside contact 220b. Backside power delivery network 228 is formed over the semiconductor structure 300 including backside power lines 224, 226a and 226b and is based on creation of a wiring scheme that is disposed on both sides of the device layer (front end of line structure).

Figure 12:
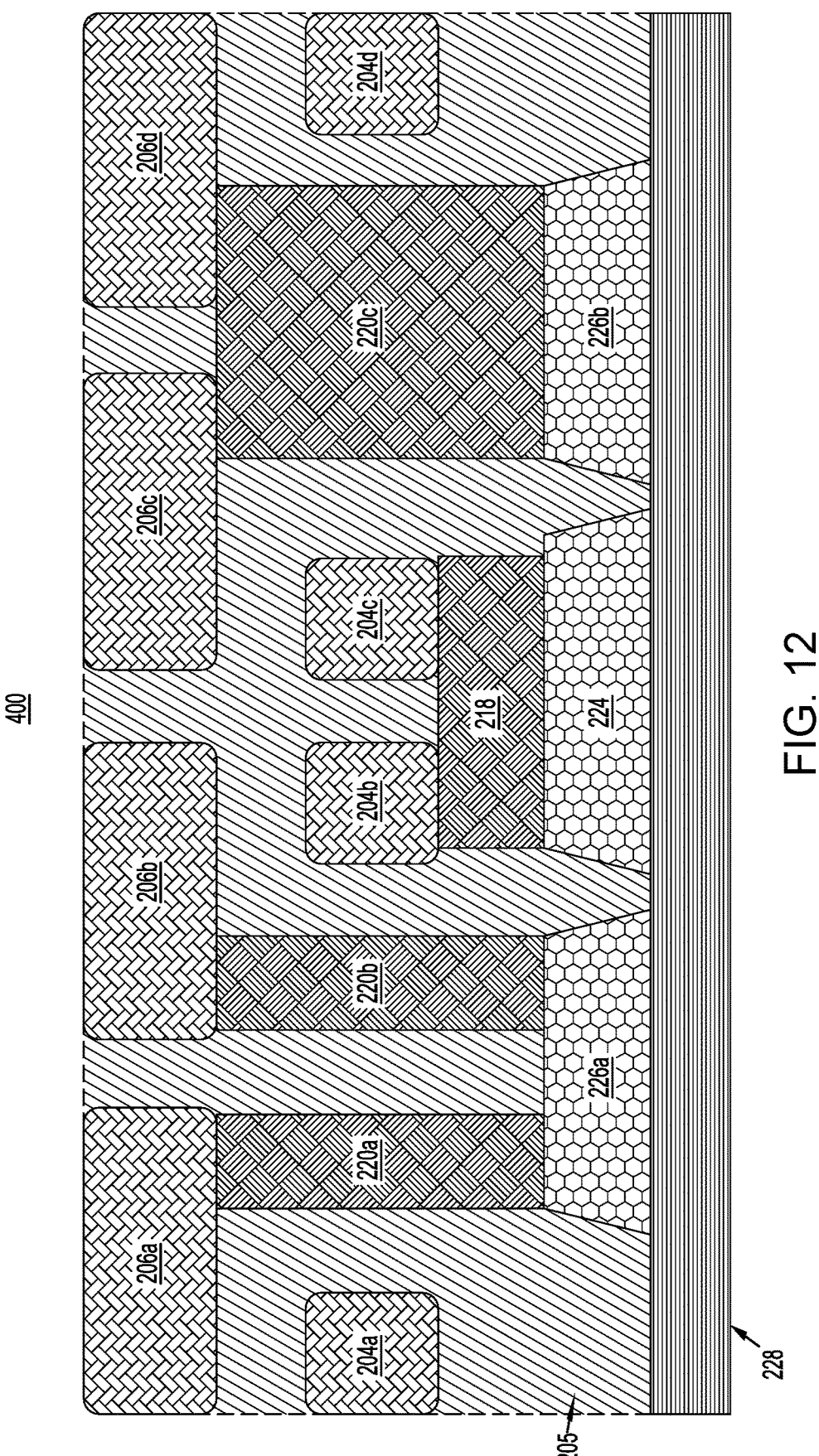
FIG. 12 is a schematic cross-sectional side view of a semiconductor structure, according to one or more alternative illustrative embodiments.

In another non-limiting illustrative embodiment as generally depicted in FIG. 12, semiconductor structure 400 includes second devices 206a, 206b, 206c and 206d formed in a stacked configuration with respective first devices 204a, 204b, 204c and 204d. First devices 204b and 204c are connected to backside power line 224 via backside contact 218. Second devices 206a and 206b are each connected to backside power line 226a via respective backside contacts 220a and 220b, and second devices 206c and 206d are connected to backside power line 226b via backside contact 220c. Backside power delivery network 228 is formed over the semiconductor structure 400 including backside power lines 224, 226a and 226b and is based on creation of a wiring scheme that is disposed on both sides of the device layer (front end of line structure).

Figure 13:
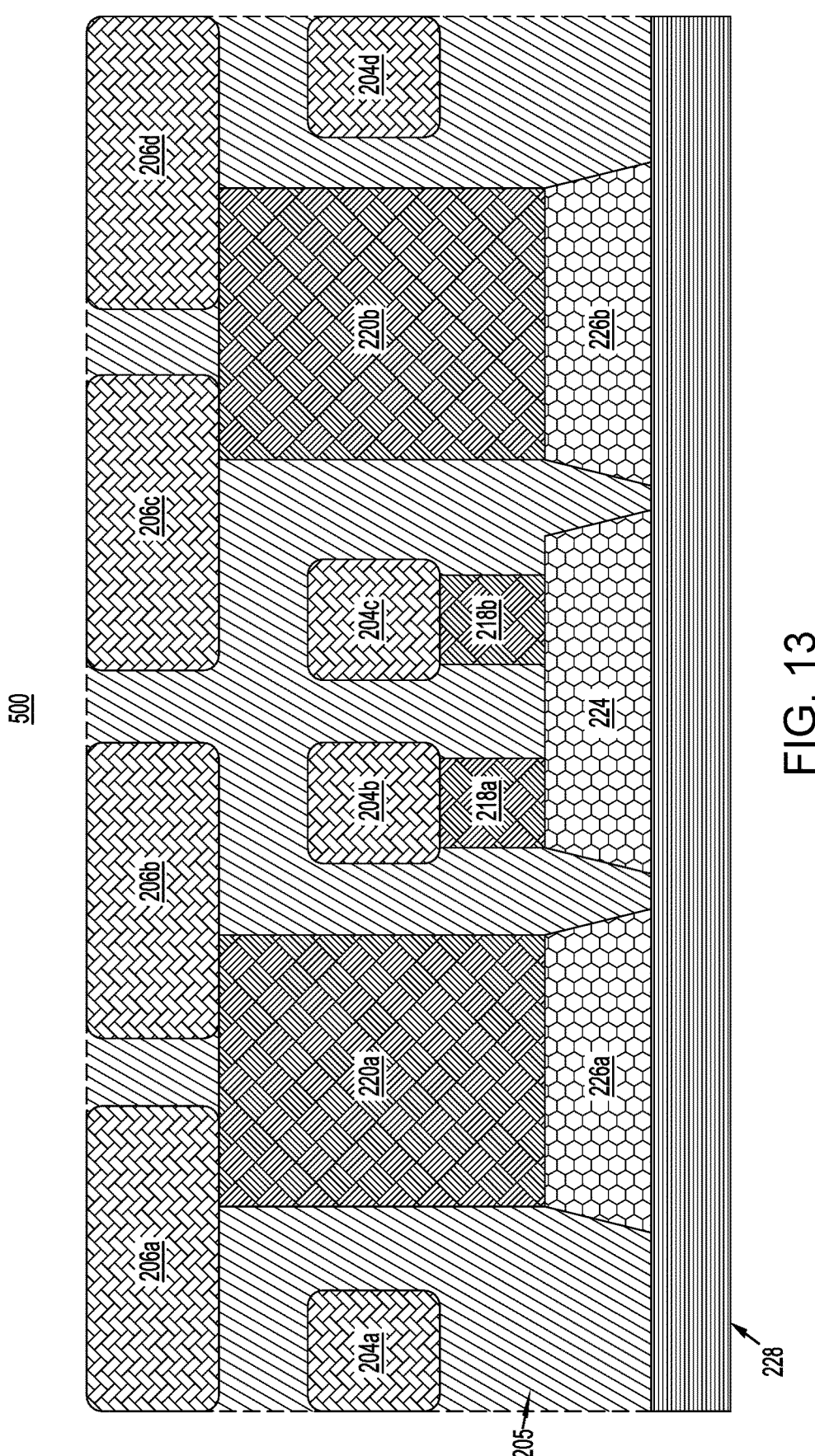
FIG. 13 is a schematic cross-sectional side view of a semiconductor structure, according to one or more alternative illustrative embodiments.

In another non-limiting illustrative embodiment as generally depicted in FIG. 13, semiconductor structure 500 includes second devices 206a, 206b, 206c and 206d formed in a stacked configuration with respective first devices 204a, 204b, 204c and 204d. First devices 204b and 204c are each connected to backside power line 224 via respective backside contacts 218a and 218b. Second devices 206a and 206b are connected to backside power line 226a via backside contact 220a, and second devices 206c and 206d are connected to backside power line 226b via backside contact 220b. Backside power delivery network 228 is formed over the semiconductor structure 500 including backside power lines 224, 226a and 226b and is based on creation of a wiring scheme that is disposed on both sides of the device layer (front end of line structure).

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A semiconductor structure, comprising:
   a first stacked device structure comprising a first device and a second device over the first device in a stacked configuration,
   a first backside contact connected to the first device and a first backside power line;
   a second backside contact connected to the second device and a second backside power line; and
   a second stacked device structure adjacent the first stacked device structure and comprising a third device and a fourth device over the third device in a stacked configuration;
   wherein the first backside contact is connected to the third device and the first backside power line.

2. The semiconductor structure of claim 1, wherein the first device has a first width and the second device has a second width greater than the first width.

3. The semiconductor structure of claim 1, wherein the first backside contact has a first height and the second backside contact has a second height greater than the first height.

4. The semiconductor structure of claim 1, wherein the first device has a first width and the second device has a second width greater than the first width, and wherein the first backside contact has a first height and the second backside contact has a second height greater than the first height.

5. The semiconductor structure of claim 1, wherein the first device and the second device are stacked in a staggard configuration.

6. The semiconductor structure of claim 5, further comprising a frontside metal via connecting the first device to a frontside back-end-of-line interconnect.

7. The semiconductor structure of claim 1,
   wherein the second backside contact is connected to the fourth device and the second backside power line.

8. The semiconductor structure of claim 7, wherein the first device has a first width and the second device has a second width greater than the first width, and wherein the third device has a third width and the fourth device has a fourth width greater than the third width.

9. The semiconductor structure of claim 1, further comprising:
   a third backside contact connected to the fourth device and the second backside power line;
   wherein the first backside contact is connected to the third device and the first backside power line.

10. The semiconductor structure of claim 9, wherein the first device has a first width and the second device has a second width greater than the first width, and wherein the third device has a third width and the fourth device has a fourth width greater than the third width.

11. The semiconductor structure of claim 1, further comprising:
   a third backside contact connected to the third device and the first backside power line;
   wherein the second backside contact is connected to the fourth device and the second backside power line.

12. An integrated circuit, comprising:
   one or more semiconductor structures, wherein at least one of the one or more semiconductor structures comprises:
      a first stacked device structure comprising a first device and a second device over the first device in a stacked configuration;
      a first backside contact connected to the first device and a first backside power line;
      a second backside contact connected to the second device and a second backside power line; and
      a second stacked device structure adjacent the stacked device structure and comprising a third device and a fourth device over the third device in a stacked configuration;
      wherein the first backside contact is connected to the third device and the first backside power line.

13. The integrated circuit of claim 12, wherein the first device has a first width and the second device has a second width greater than the first width.

14. The integrated circuit of claim 13, wherein the first backside contact has a first height and the second backside contact has a second height greater than the first height.

15. The integrated circuit of claim 12, wherein the first device and the second device are stacked in a staggard configuration.

16. The integrated circuit of claim 15, wherein the at least one of the one or more semiconductor structures further comprises a frontside metal via connecting the first device to a frontside back-end-of-line interconnect.

17. The integrated circuit of claim 12,
   wherein the second backside contact is connected to the fourth device and the second backside power line.

18. The integrated circuit of claim 12, wherein the at least one of the one or more semiconductor structures further comprises:
   a third backside contact connected to the fourth device and the second backside power line;
   wherein the first backside contact is connected to the third device and the first backside power line.

19. The integrated circuit of claim 12, wherein the at least one of the one or more semiconductor structures further comprises:

a third backside contact connected to the third device and the first backside power line;

wherein the second backside contact is connected to the fourth device and the second backside power line.

20. A method, comprising:

forming a second device over a first device in a stacked configuration;

forming a first backside contact connected to the first device;

forming a second backside contact connected to the second device;

forming a first backside power line connected to the first backside contact;

forming a second backside power line connected to the second backside contact; and forming a fourth device over a third device in a stacked configuration;

wherein the first backside contact is connected to the third device and the first backside power line.

\* \* \* \* \*